(12) United States Patent
Tazzoli et al.

(10) Patent No.: US 10,170,893 B1
(45) Date of Patent: Jan. 1, 2019

(54) VACUUM FIXTURE

(71) Applicant: Waymo LLC, Mountain View, CA (US)

(72) Inventors: Augusto Tazzoli, San Jose, CA (US); Pierre-Yves Droz, Los Altos, CA (US); Nathaniel Golshan, Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 15/672,496

(22) Filed: Aug. 9, 2017

(51) Int. Cl.
 *H01L 21/683* (2006.01)
 *H01S 5/40* (2006.01)
 *H01L 21/68* (2006.01)

(52) U.S. Cl.
 CPC .............. *H01S 5/405* (2013.01); *H01L 21/68* (2013.01); *H01L 21/6838* (2013.01)

(58) Field of Classification Search
 CPC ........ H01S 5/4043; H01S 5/426; H01S 5/405; H01L 25/0756; H01L 25/13; H01L 21/68; H01L 21/6838
 See application file for complete search history.

(56) References Cited

U.S. PATENT DOCUMENTS

| | | | | |
|---|---|---|---|---|
| 3,949,295 A | * | 4/1976 | Moorshead | B25B 11/005 324/750.14 |
| 4,361,091 A | * | 11/1982 | Pearrow | B41F 27/005 101/389.1 |
| 5,394,426 A | | 2/1995 | Joslin | |
| 5,498,973 A | * | 3/1996 | Cavaliere | G01R 31/2635 324/750.2 |
| 5,835,515 A | * | 11/1998 | Huang | G02B 6/4249 372/36 |
| 6,045,321 A | | 4/2000 | Freund et al. | |
| 6,352,873 B1 | * | 3/2002 | Hoden | H01S 5/02264 438/25 |

(Continued)

FOREIGN PATENT DOCUMENTS

WO WO-0145178 A1 * 6/2001 ......... H01L 21/6838

OTHER PUBLICATIONS

Feeler et al., High-density pulsed laser diode arrays for SSL pumping, Northrop Grumman Cutting Edge Optronics Application Note #15, Mar. 29, 2010.

*Primary Examiner* — Joshua King
(74) *Attorney, Agent, or Firm* — McDonnell Boehnen Hulbert & Berghoff LLP

(57) ABSTRACT

An example method includes stacking a plurality of laser diode bars proximate an alignment plate. Each respective laser diode bar has a front edge through which the respective laser diode bar emits light. The alignment plate has a first side that provides a common plane for aligning the front edges of the laser diode bars and a second side opposite the first side. The alignment plate has a plurality of microholes extending between the first and second sides. The method also includes applying suction to the plurality of laser diode bars through the plurality of microholes. The suction draws the front edges of the laser diode bars against the first side of the alignment plate such that the front edges of the laser diode bars are aligned in the common plane. Conductive plates used to clamp the plurality of laser diodes therebetween may be aligned in a similar fashion.

13 Claims, 8 Drawing Sheets

(56) References Cited

U.S. PATENT DOCUMENTS

| | | | |
|---|---|---|---|
| 6,927,086 B2* | 8/2005 | Hazlett | H01S 5/02252 |
| | | | 438/107 |
| 7,268,005 B2 | 9/2007 | Chen et al. | |
| 8,518,814 B2 | 8/2013 | Stephens et al. | |
| 2003/0012638 A1* | 1/2003 | Berger | H01L 21/68 |
| | | | 414/800 |
| 2003/0031227 A1* | 2/2003 | Takigawa | H01S 3/0941 |
| | | | 372/75 |
| 2003/0185963 A1* | 10/2003 | Lixiang | H01S 5/028 |
| | | | 427/1 |
| 2004/0061346 A1* | 4/2004 | Capewell | H01L 21/67144 |
| | | | 294/185 |
| 2005/0101039 A1* | 5/2005 | Chen | H01S 5/028 |
| | | | 438/21 |
| 2009/0016398 A1* | 1/2009 | Lorenzen | H01S 5/4043 |
| | | | 372/50.12 |
| 2010/0325884 A1* | 12/2010 | Nishino | H05K 3/305 |
| | | | 29/833 |
| 2012/0168089 A1* | 7/2012 | Schmidt-Lange | B65G 47/91 |
| | | | 156/538 |
| 2013/0122610 A1* | 5/2013 | Chung | H01L 21/6838 |
| | | | 438/7 |
| 2014/0130691 A1* | 5/2014 | Yang | H01L 21/6838 |
| | | | 101/382.1 |

\* cited by examiner

VACUUM FIXTURE

BACKGROUND

A laser diode is an electrically pumped semiconductor laser in which the active laser medium is formed by a PN or PIN junction of a semiconductor diode. Several laser diodes may be included on a single semiconductor substrate to form a laser diode bar. The laser diodes may be oriented in the same direction on the substrate to form an edge or facet from which light is emitted. The laser diode bars can be stacked between two conductive substrates, with the emitting edges oriented in the same direction, to form a two-dimensionally emitting surface. The laser diode bar stack may be used for pumping solid state lasers.

SUMMARY

In an example embodiment, a vacuum fixture may be used to align respective light-emitting edges or faces of a plurality of stacked laser diode bars in a common plane. The common plane may be provided by an alignment plate that includes therein a plurality of microholes arranged in a pattern, such as a pattern of linear arrays or a random pattern. As the laser diode bars are stacked proximate the alignment plate, suction may be provided through the microholes to pull the laser diode bars against the alignment plate, thereby aligning their respective light-emitting edges in the common plane. The microholes may be arranged in the pattern (e.g., linear arrays) to ensure that each laser diode bar receives suction through at least one microhole in at least two linear arrays. The aligned laser diode bars may then be clamped together to maintain the alignment.

In a first embodiment, a method is provided that includes stacking a plurality of laser diode bars proximate an alignment plate. Each respective laser diode bar in the plurality of laser diode bars has a front edge through which the respective laser diode bar is configured to emit light and has an upper surface and a lower surface that are perpendicular to the front edge. The alignment plate has a first side that provides a common plane for aligning the front edges of the laser diode bars and a second side opposite the first side. The alignment plate has a plurality of microholes extending between the first and second sides. The method also includes applying suction to the plurality of laser diode bars through the plurality of microholes. The suction draws the front edges of the laser diode bars against the first side of the alignment plate such that the front edges of the laser diode bars are aligned in the common plane.

In a second embodiment, a system is provided that includes an alignment plate having a first side that provides a common plane for aligning a respective front edge of each of a plurality of stacked semiconductor dies. Each respective semiconductor die in the plurality of stacked semiconductor dies has an upper surface and a lower surface that are perpendicular to the respective front edge. The alignment plate also has a second side opposite the first side and a plurality of microholes extending between the first and second sides. The system additionally includes a suction fixture having a connector configured to connect to a source of suction. The suction fixture also has a cavity defined within the suction fixture and in fluid communication with the connector. The suction fixture is configured to interface with the alignment plate to position the cavity proximate (i) the second side of the alignment plate and (ii) the plurality of microholes to apply suction to the plurality of stacked semiconductor dies through the plurality of microholes.

In a third embodiment, a non-transitory computer readable storage medium is provided having stored thereon instructions that, when executed by a computing device, cause the computing device to perform operations. The operations include providing instructions to cause a robotic device to stack a plurality of laser diode bars proximate an alignment plate. Each respective laser diode bar in the plurality of laser diode bars has a front edge through which the respective laser diode bar is configured to emit light and has an upper surface and a lower surface that are perpendicular to the front edge. The alignment plate has a first side that provides a common plane for aligning the front edges of the laser diode bars and a second side opposite the first side. The alignment plate has a plurality of microholes extending between the first and second sides. The operations also include providing instructions to cause a suction device to applying suction to the plurality of laser diode bars through the plurality of microholes. The suction draws the front edges of the laser diode bars against the first side of the alignment plate such that the front edges of the laser diode bars are aligned in the common plane.

In a fourth embodiment, a system is provided that includes means for providing instructions to cause a robotic device to stack a plurality of laser diode bars proximate an alignment plate. Each respective laser diode bar in the plurality of laser diode bars has a front edge through which the respective laser diode bar is configured to emit light and has an upper surface and a lower surface that are perpendicular to the front edge. The alignment plate has a first side that provides a common plane for aligning the front edges of the laser diode bars and a second side opposite the first side. The alignment plate has a plurality of microholes extending between the first and second sides. The system also includes means for providing instructions to cause a suction device to applying suction to the plurality of laser diode bars through the plurality of microholes. The suction draws the front edges of the laser diode bars against the first side of the alignment plate such that the front edges of the laser diode bars are aligned in the common plane.

These as well as other embodiments, aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

DETAILED DESCRIPTION

Figure 1:
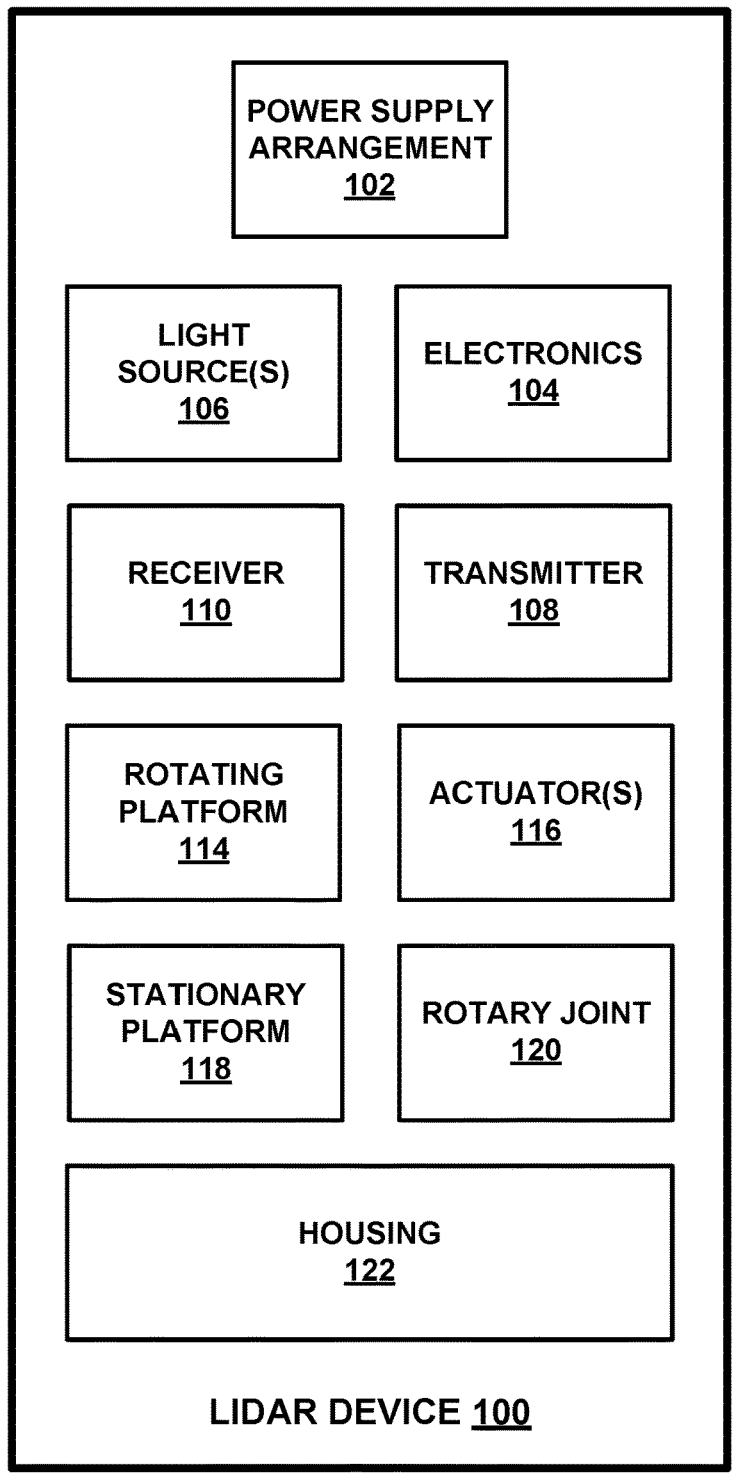
FIG. 1 illustrates a block diagram of an example LIDAR device, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless indicated as such. Other embodiments can be utilized, and other changes can be made, without departing from the scope of the subject matter presented herein.

Thus, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Throughout this description, the articles "a" or "an" are used to introduce elements of the example embodiments. Any reference to "a" or "an" refers to "at least one," and any reference to "the" refers to "the at least one," unless otherwise specified, or unless the context clearly dictates otherwise. The intent of using the conjunction "or" within a described list of at least two terms is to indicate any of the listed terms or any combination of the listed terms.

The use of ordinal numbers such as "first," "second," "third" and so on is to distinguish respective elements rather than to denote a particular order of those elements. For purpose of this description, the terms "multiple" and "a plurality of" refer to "two or more" or "more than one."

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment. In the figures, similar symbols typically identify similar components, unless context dictates otherwise. Further, unless otherwise noted, figures are not drawn to scale and are used for illustrative purposes only. Moreover, the figures are representational only and not all components are shown. For example, additional structural or restraining components might not be shown.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. OVERVIEW

Disclosed herein are example embodiments of a vacuum fixture and methods of use thereof for stacking and aligning laser diode bars. A laser diode bar can be in the shape of a slab (e.g., a rectangular solid) with a front (emitting) edge through which the laser beam is emitted. Further, each laser diode bar has a vertical axis that is parallel to the front edge and extends through an upper surface and a lower surface of the laser diode bar. The upper and lower surfaces can be conductive to allow for electrical connection to the laser diode bar. In a vertically stacked arrangement of laser diode bars, the vertical axes of the laser diode bars are aligned so that the upper surface of a laser diode bar is in contact with the lower surface of an adjacent laser diode bar in the stack. In this way, any number of laser diode bars can be electrically connected together in a vertically stacked arrangement.

In this vertically stacked arrangement, it may be desirable for the front edges of all of the laser diode bars to be aligned as closely as possible to, for example, achieve a desired beam quality of the emitted laser light. To facilitate this alignment, a vacuum fixture described herein may be used.

The vacuum fixture includes an alignment plate and a suction fixture. The alignment plate has a first side that provides a common plane against which front edges of the plurality of stacked laser diode bars may be aligned, and a second side opposite the first side. The alignment plate also includes therein a plurality of microholes extending from the first side to the second side and arranged in a pattern, such as linear arrays, a staggered grid, or a random distribution, among other possibilities. A suction source can apply suction through the microholes from the second side to the first side. The suction fixture is configured to matingly interface with the alignment plate to channel suction from the suction source through the microholes.

In order to align the front edges of the laser diode bars in the common plane, the laser diode bars may be stacked (e.g., sequentially) on top of one another with their front edges placed proximate the microholes of the alignment plate. As the laser diode bars are stacked proximate the alignment plate, suction may be provided through the microholes to pull their front edges against the alignment plate, thereby aligning the front edges in the common plane. The aligned laser diode bars may then be clamped together to maintain the aligned arrangement of front edges. The clamping may also facilitate good electrical contact between adjacent laser diode bars in the stack.

The microholes may be arranged in the linear arrays such that each laser diode bar receives suction through at least two microholes, each in a different linear array. The linear arrays may be at an angle (e.g., a 30-degree angle) with respect to the surfaces between the stacked laser diode bars. The arrangement of microholes into linear arrays may also allow laser diode bars of varying thickness to be stacked without having to redesign the microhole size and positioning. In an alternative embodiment, the microholes may be randomly distributed or arranged in a staggered grid such that each laser diode bar received suction through at least two microholes.

In one example, the microholes may be approximately on the same order of magnitude in size as the thickness of the laser diode bars. For example, a laser diode bar having a thickness of 150 microns may be aligned using a microhole of size ranging from 100 microns to 250 microns. The alignment plate may be manufactured from a printed circuit board (PCB) substrate using PCB fabrication techniques to achieve the desired size of the microholes. A metal layer may be deposited on at least the first side of the PCB to create a planar surface with a desired texture or roughness and provide structural rigidity to the alignment plate.

The vertical stack of laser diode bars may be clamped together between a first conductive plate and a second conductive plate that serve as electrodes and heat sinks for the vertical stacks. The alignment plate may thus further include a first plurality of macroholes and a second plurality of macroholes for aligning the first and second conductive plates in the common plane. The first plurality of macroholes may be positioned below the plurality of microholes to provide suction to the first conductive plate on top of which the laser diode bars are to be stacked. The second plurality of macroholes may be positioned above the plurality of microholes to provide suction to the second conductive plate which is disposed on top of the vertical stack of laser diode bars. The macroholes may be larger than the microholes.

The suction fixture may provide for suction to be selectively applied to the first plurality of macroholes, the second plurality of macroholes, and the plurality of microholes. For example, the suction fixture may include three connectors configured to connect to respective sources of suction and three corresponding cavities in fluid communication with the connectors. When the suction fixture is assembled with the alignment plate, each of the cavities provides suction to only one corresponding set of holes. That is, suction from the first connector is directed only through the first plurality of macroholes, suction from the second connector is directed only through the plurality of microholes, and suction from the third connector is directed only through the second plurality of macroholes. The suction order may be manually or automatically controlled by a combination of valves and switches.

An example method for stacking laser diodes bars may include aligning the first conductive plate against the first side of the alignment plate by applying suction through the first plurality of macroholes. A first laser diode bar can then be placed on top of the first conductive plate, and the front edge of the first laser diode bar may be aligned against the first side of the alignment plate by applying suction through at least some of the microholes. A second laser diode bar can then be placed on top of the first laser diode bar, and the front edge of the second laser diode bar can be aligned against the first side of the alignment plate by applying suction through at least some of the microholes. One or more additional laser diode bars can be aligned in this way to complete the stack. Once the stack of laser diode bars has been aligned, the second conductive plate may be aligned by the suction through the second plurality of macroholes. The stack of laser diode bars can then be clamped together through the first and second conductive plates.

II. EXAMPLE LIDAR DEVICES

Referring now to the Figures, FIG. 1 is a simplified block diagram of a LIDAR device 100, according to an example embodiment. As shown, LIDAR device 100 includes a power supply arrangement 102, electronics 104, light source(s) 106, a transmitter 108, a receiver 110, a rotating platform 114, actuator(s) 116, a stationary platform 118, a rotary link 120, and a housing 122. In other embodiments, LIDAR device 100 may include more, fewer, or different components. Additionally, the components shown may be combined or divided in any number of ways.

Power supply arrangement 102 may be configured to supply power to various components of LIDAR device 100. In particular, power supply arrangement 102 may include or otherwise take the form of at least one power source disposed within LIDAR device 100 and connected to various components of LIDAR device 100 in any feasible manner, so as to supply power to those components. Additionally or alternatively, power supply arrangement 102 may include or otherwise take the form of a power adapter or the like that is configured to receive power from one or more external power sources (e.g., from a power source arranged in a vehicle to which LIDAR device 100 is coupled) and to supply that received power to various components of LIDAR device 100 in any feasible manner. In either case, any type of power source may be used such as, for example, a battery.

Electronics 104 may include one or more electronic components and/or systems each arranged to help facilitate certain respective operations of LIDAR device 100. In practice, these electronics 104 may be disposed within LIDAR device 100 in any feasible manner. For instance, at least some of electronics 104 may be disposed within a central cavity region of rotary joint 120. Nonetheless, electronics 104 may include various types of electronic components and/or systems.

For example, electronics 104 may include various wirings used for transfer of control signals from a controller to various components of LIDAR device 100 and/or for transfer of data from various components of LIDAR device 100 to the controller. Generally, the data that the controller receives may include sensor data based on detections of light by receiver 110, among other possibilities. Moreover, the control signals sent by the controller may operate various components of LIDAR device 100, such as by controlling emission of light by transmitter 106, controlling detection of light by receiver 110, and/or controlling actuator(s) 116 to rotate rotating platform 114, among other possibilities.

In some arrangements, electronics 104 may also include the controller at issue. This controller may have one or more processors, data storage, and program instructions stored on the data storage and executable by the one or more processor to facilitate various operations. Additionally or alternatively, the controller may communicate with an external controller or the like (e.g., a computing system arranged in a vehicle to which LIDAR device 100 is coupled) so as to help facilitate transfer of control signals and/or data between the external controller and the various components of LIDAR device 100.

In other arrangements, however, electronics 104 might not include the controller at issue. Rather, at least some of the above-mentioned wirings may be used for connectivity to an external controller. With this arrangement, the wirings may help facilitate transfer of control signals and/or data between the external controller and the various components of LIDAR device 100. Other arrangements are possible as well.

Further, one or more light sources 106 can be configured to emit, respectively, a plurality of light beams and/or pulses having wavelengths within a wavelength range. The wavelength range could, for example, be in the ultraviolet, visible, and/or infrared portions of the electromagnetic spectrum. In some examples, the wavelength range can be a narrow wavelength range, such as provided by lasers.

In some arrangements, the one or more light sources 106 may include laser diodes (e.g., vertically stacked laser diode bars), light emitting diodes (LED), vertical cavity surface emitting lasers (VCSEL), organic light emitting diodes (OLED), polymer light emitting diodes (PLED), light emitting polymers (LEP), liquid crystal displays (LCD), microelectromechanical systems (MEMS), and/or any other device configured to selectively transmit, reflect, and/or emit light to provide the plurality of emitted light beams and/or pulses.

In some embodiments, transmitter 108 may be configured to emit light into an environment. In particular, transmitter 108 may include an optical arrangement that is arranged to direct light from a light source 106 toward the environment. This optical arrangement may include any feasible combination of mirror(s) used to guide propagation of the light throughout physical space and/or lens(es) used to adjust certain characteristics of the light, among other optical components. For instance, the optical arrangement may include a transmit lens arranged to collimate the light, thereby resulting in light having rays that are substantially parallel to one another.

As noted, LIDAR device 100 may include receiver 110. Receiver 110 may be configured to detect light having wavelengths in the same wavelength range as the one of the light emitted from transmitter 108. In this way, LIDAR device 100 may distinguish reflected light pulses originated at LIDAR device 100 from other light in the environment.

Additionally, receiver 110 may be configured to scan the environment with a field of view (FOV). For instance, the FOV of receiver 110 may allow for detection of light substantially along the same angular range as the light emitted by transmitter 108. In an example implementation, receiver 110 may have an optical arrangement that allows the receiver to provide the FOV a particular resolution. Generally, such optical arrangement may be arranged to provide an optical path between at least one optical lens and a photodetector array.

In one implementation, receiver 110 may include an optical lens arranged to focus light reflected from one or more objects in the environment of LIDAR device 100 onto detectors of receiver 110.

Furthermore, as noted, receiver 110 may have a photodetector array, which may include one or more detectors configured to convert detected light (e.g., in the above-mentioned wavelength range) into an electrical signal indicative of the detected light. In practice, such a photodetector array could be arranged in one of various ways. For example, the detectors can be disposed on one or more substrates (e.g., printed circuit boards (PCBs), flexible PCBs, etc.) and arranged to detect incoming light that is traveling along the optical path from the optical lens. In general, a component disposed on a substrate may be disposed above or beneath the substrate. Also, such a photodetector array could include any feasible number of detectors aligned in any feasible manner. For example, the photodetector array may include a 13×16 array of detectors. It is noted that this photodetector array is described for exemplary purposes only and is not meant to be limiting.

Generally, the detectors of the array may take various forms. For example, the detectors may take the form of photodiodes, avalanche photodiodes, phototransistors, cameras, active pixel sensors (APS), charge coupled devices (CCD), cryogenic detectors, and/or any other sensor of light configured to receive focused light having wavelengths in the wavelength range of the emitted light. Other examples are possible as well.

Further, as noted, LIDAR device 100 may include rotating platform 114 that is configured to rotate about an axis. In order to rotate in this manner, one or more actuators 116 may actuate rotating platform 114. In practice, actuators 116 may include motors, pneumatic actuators, hydraulic pistons, and/or piezoelectric actuators, among other possibilities.

In an example embodiment, transmitter 108 and receiver 110 may be arranged on the rotating platform such that each of these components moves relative to the environment based on rotation of rotating platform 114. In particular, each of these components could be rotated relative to an axis so that LIDAR device 100 may obtain information from various directions. In this manner, LIDAR device 100 may have a horizontal viewing direction that can be adjusted by actuating rotating platform 114 to different directions.

With this arrangement, a controller could direct actuator 116 to rotate rotating platform 114 in various ways so as to obtain information about the environment in various ways. In particular, rotating platform 114 could rotate at various extents and in either direction. For example, rotating platform 114 may carry out full revolutions such that LIDAR device 100 provides a 360° horizontal FOV of the environment.

Moreover, rotating platform 114 could rotate at various rates so as to cause LIDAR device 100 to scan the environment at various refresh rates. For example, LIDAR device 100 may be configured to have a refresh rate of 15 Hz (e.g., fifteen complete rotations of LIDAR device 100 per second). In this example, assuming that LIDAR device 100 is coupled to a vehicle as further described below, the scanning thus involves scanning a 360° FOV around the vehicle fifteen times every second. Other examples are also possible.

Yet further, as noted, LIDAR device 100 may include stationary platform 118. In practice, the stationary platform may take on any shape or form and may be configured for coupling to various structures, such as to a top of a vehicle for example. Also, the coupling of the stationary platform may be carried out via any feasible connector arrangement (e.g., bolts and/or screws). In this way, LIDAR device 100 could be coupled to a structure so as to be used for various purposes, such as those described herein.

In accordance with the present disclosure, LIDAR device 100 may also include rotary joint 120 that directly or indirectly couples stationary platform 118 to rotating platform 114. Specifically, rotary joint 120 may take on any shape, form and material that provides for rotation of rotating platform 114 about an axis relative to stationary platform 118. For instance, rotary joint 120 may take the form of a shaft or the like that rotates based on actuation from actuator 116, thereby transferring mechanical forces from actuator 116 to rotating platform 114. Moreover, as noted, the rotary joint may have a central cavity in which electronics 104 and/or one or more other components of LIDAR device 100 may be disposed. Other arrangements are possible as well.

Yet further, as noted, LIDAR device 100 may include housing 122. In practice, housing 122 may take on any shape, form, and material. For example, housing 122 can be a dome-shaped housing, among other possibilities. In another example, housing 122 may be composed of a material that is at least partially non-transparent, which may allow for blocking of at least some light from entering the interior space of housing 122 and thus help mitigate thermal effects as further discussed below. It is noted that this housing is described for exemplary purposes only and is not meant to be limiting.

In accordance with the present disclosure, housing 122 may be coupled to rotating platform 114 such that housing 122 is configured to rotate about the above-mentioned axis based on rotation of rotating platform 114. With this implementation, transmitter 108, receiver 110, and possibly other components of LIDAR device 100 may each be disposed within housing 122. In this manner, transmitter 108 and receiver 110 may rotate along with housing 122 while being disposed within housing 122.

Moreover, housing 122 may have an aperture formed thereon, which could take on any feasible shape and size. In this regard, transmitter 108 could be arranged within housing 120 so as to emit light into the environment through the aperture. In this way, transmitter 108 may rotate along with the aperture due to corresponding rotation of housing 120, thereby allowing for emission of light into various directions. Also, receiver 110 could be arranged within housing 120 so as to detect light that enters housing 120 from the environment through the aperture. In this way, receiver 110 may rotate along with the aperture due to corresponding rotating of housing 120, thereby allowing for detection of the light incoming from various directions along the horizontal FOV.

In practice, housing 122 may be arranged as described above for various reasons. Specifically, due to various components of LIDAR device 100 being disposed within housing 122 and due to housing 122 rotating along with those components, housing 122 may help protect those components from various environmental hazards, such as rain and/or snow, among others. Also, if housing 122 were to be stationary as LIDAR device 100 rotates within housing 122, then housing 122 would likely be transparent so as to allow for propagation of light through housing 122 and thus for scanning of the environment by LIDAR device 100.

In an example embodiment, however, housing 122 may have the aperture that rotates along with LIDAR device 100, which means that housing 122 does not necessarily need to be fully transparent to allow for scanning of the environment. For example, housing 122 could be composed of at least a partially non-transparent material, except for the aperture, which could be composed of a transparent material. As a result, housing 122 may help mitigate thermal effects on LIDAR device 100. For instance, housing 122 may block sun rays from entering the interior space of housing 122, which may help avoid overheating of various components of LIDAR device 100 due to those sun rays. Other instances are possible as well.

Given the various components of LIDAR device 100 as described above, these various components could be arranged in various ways. In an example embodiment, assuming that LIDAR device 100 is spatially oriented such that stationary platform 118 is closest to a ground surface, LIDAR device 100 may be arranged such that receiver 110 is positioned substantially above stationary platform 118 and transmitter 108 is positioned substantially above receiver 110. However, it is noted that this arrangement is described for exemplary purposes only and is not meant to be limiting.

III. EXAMPLE VEHICLE SYSTEM

Figure 2:
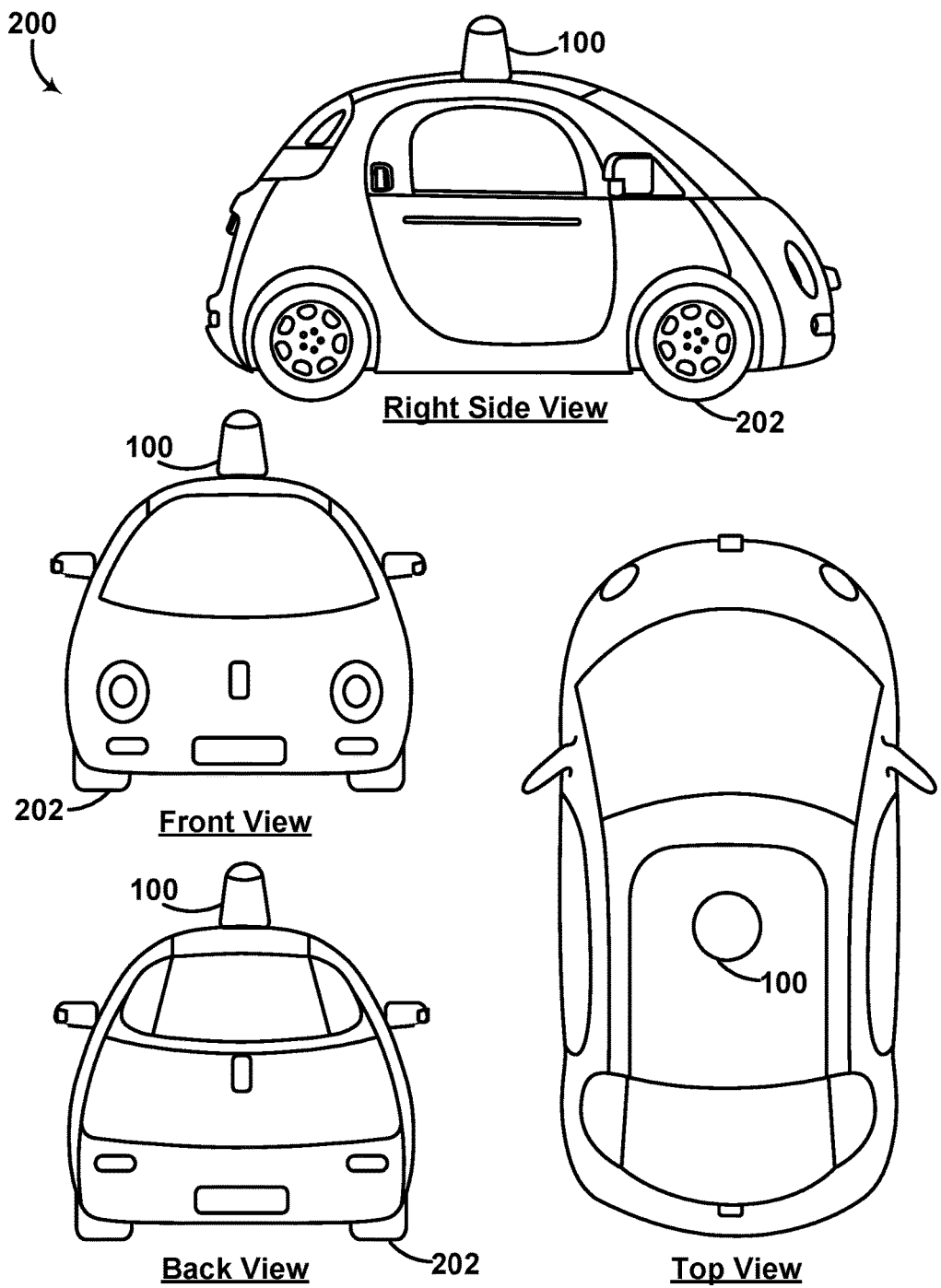
FIG. 2 illustrates several views of a LIDAR device positioned on top of a vehicle, according to an example embodiment.

FIG. 2 shows a Right Side View, Front View, Back View, and Top View of a vehicle 200. LIDAR device 100 may be positioned on a top side of vehicle 200, opposite a bottom side on which wheels 202 are located. LIDAR 100 may be configured to scan an environment around vehicle 200 (e.g., at a refresh rate of 15 Hz) by rotating about the vertical axis while emitting one or more light pulses and detecting reflected light pulses off objects in the environment of vehicle 200. Vehicle 200 may in turn be configured to operate autonomously or semi-autonomously based on the scan data acquired by LIDAR 100.

In some implementations, LIDAR 100 may be positioned on another portion of vehicle 200. Further, multiple LIDAR devices could be positioned on different portions of the vehicle (e.g., one LIDAR device on each corner of the vehicle) so that each LIDAR device is able to scan a different portion of the environment.

IV. EXAMPLE LASER DIODE BAR

Figure 3A:
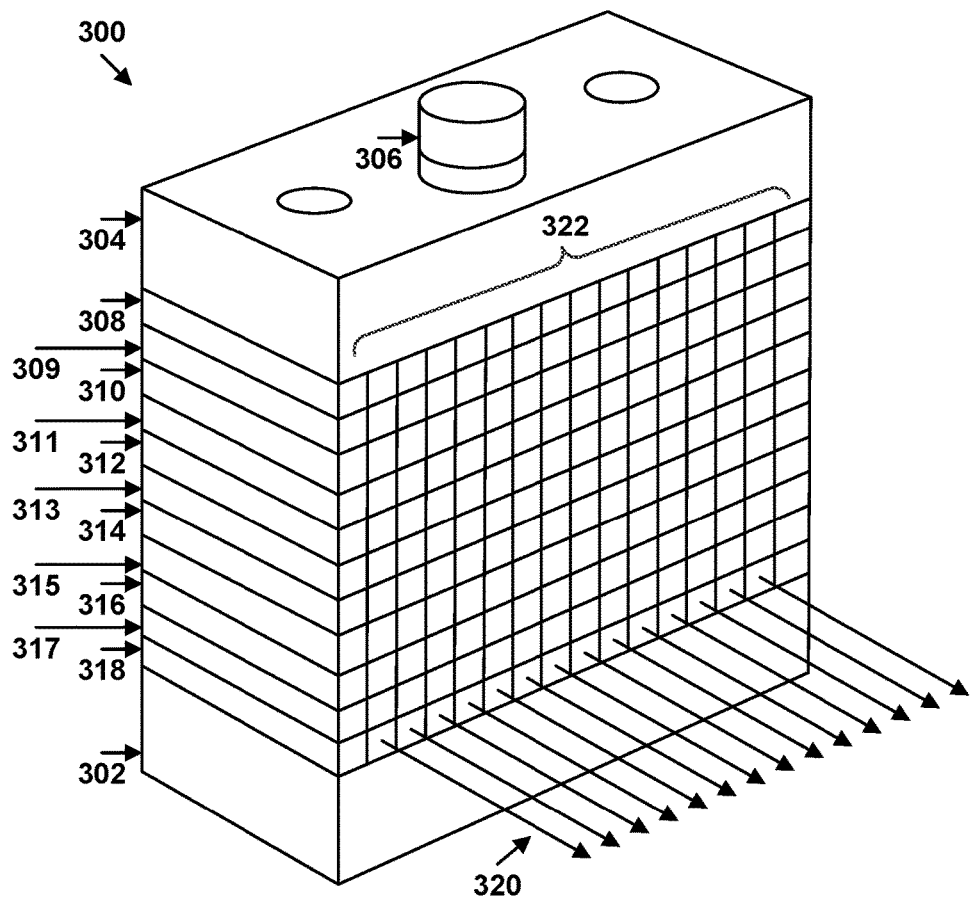
FIGS. 3A and 3B illustrate a stack of laser diode bars, according to an example embodiment.
Figure 3B:
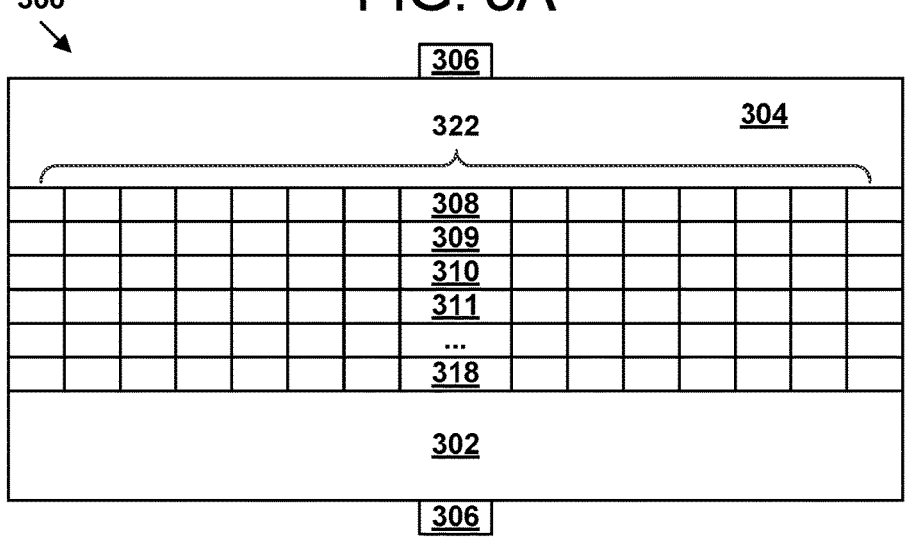

FIGS. 3A and 3B illustrate different views of an example vertical stack 300 of a plurality of laser diode bars 308-318 (i.e., 308, 309, 310, 311, 312, 313, 314, 315, 316, 317, and 318). Laser diode bars 308-318 may be sandwiched between a bottom conductive plate, slab, or substrate 302 and a top conductive plate, slab, or substrate 304. A fastener 306 (e.g., screw or bolt) may be used to clamp conductive plates 302 and 304 together, thereby securing laser diode bars 308-318 therebetween. The vertical stack 300 of laser diode bars 308-318 may be used as a light source in LIDAR device 100. For example, the vertical stack 100 may be used to pump a solid state laser that serves as a light source in LIDAR device 100. Laser diode pumped solid state lasers may offer a compact setup or form factor, a long lifetime, and good beam quality, thus making them more desirable than other laser sources.

Each of laser diode bars 308-318 may be in the shape of a slab (i.e., a rectangular solid) with a front (emitting) edge through which the laser beam is emitted. Each slab may include thereon a plurality of laser diodes arranged in a same orientation such that all diodes on a given bar emit light in the same direction (e.g., light 320 emitted by laser diode bar 318). Similarly, laser diode bars 308-318 may each be arranged in the same direction in vertical stack 300 such that all of the laser diode bars emit light in the same direction. For example, laser diode bars 308-318 may each be arranged to emit light from a front face 322 of vertical stack 300, as indicated by the grid pattern of laser diodes on the front face 322.

Further, each laser diode bar may have a vertical axis (not shown) that is parallel to the front edge and extends through an upper surface and lower surface of the laser diode bar. The upper and lower surfaces may be conductive to allow for electrical connection to the laser diode bar. In vertical stack 300, the vertical axes of each of the laser diode bars 308-318 are aligned so that the upper surface of a laser diode bar is in contact with the lower surface of an adjacent laser diode bar in the stack (or top conductive plate 304 in the case of the topmost laser diode bar 308). In this way, any number of laser diode bars can be electrically connected together (i.e., in series) in a vertically stacked arrangement such as vertical stack 300.

Alternatively, in some embodiments, adjacent laser diode bars may be separated by a spacer (e.g., to improve heat dissipation) or by a layer of solder. Notably, when the laser diode bar stack is designed to be driven or "pulsed" at high frequencies, it may be desirable to avoid using spacers or solder to reduce or minimize the impedance arising from any additional conductive path length, which may act as an inductor.

In a vertically stacked arrangement of laser diode bars, it may be desirable for the front edges of all of the laser diode bars 308-318 to be aligned as closely as possible. That is, it may be desirable for front face 322 of vertical stack 300 to be as flat or planar as possible to, for example, achieve a desired beam quality of the emitted laser light. To facilitate this alignment, a vacuum fixture such as the one disclosed herein may be used.

V. EXAMPLE VACUUM FIXTURE

Figure 4:
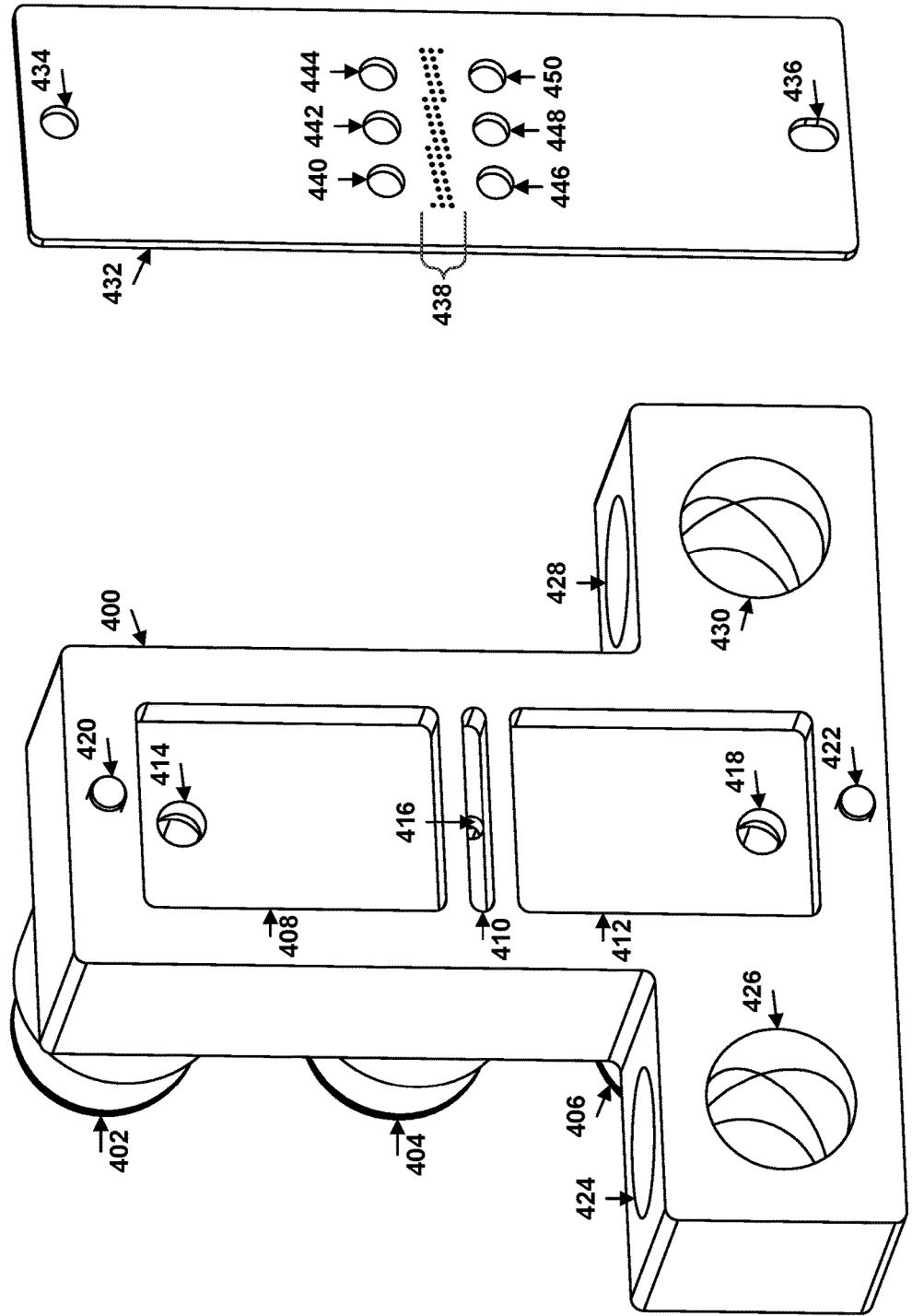
FIG. 4 illustrates a suction fixture and an alignment plate, according to an example embodiment.
Figure 5:
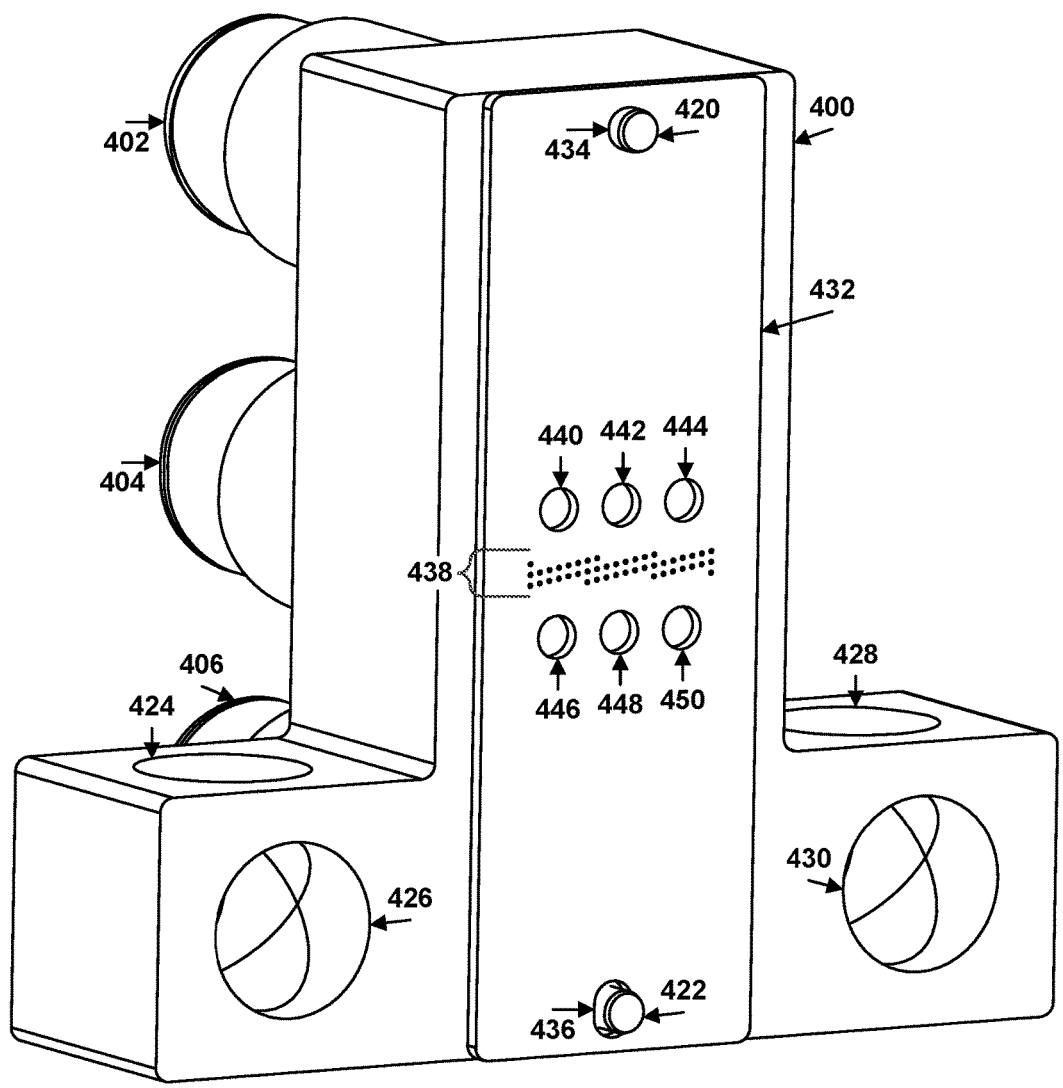
FIG. 5 illustrates the suction fixture and the alignment plate of FIG. 4 assembled together, according to an example embodiment.

FIG. 4 illustrates an example vacuum fixture that may be used to align the front edges or faces of stacked laser diode bars. The vacuum fixture includes a suction fixture 400 and an alignment plate 432 configured to interface with suction fixture 400, as illustrated in FIG. 5.

Suction fixture 400 includes a first cavity 408, a second cavity 410, and a third cavity 412, each defined within suction fixture 400. Suction fixture 400 further includes a first connector 402, a second connector 404, and a third connector 406, each configured to connect to a source of suction. Connectors 402, 404, and 406 are in fluid communication with respective chambers 408, 410, and 412 by way of openings 414, 416, and 418, respectively. Each of connectors 402, 404, and 406 may be, for example, a circular hose connector, coupling, or fitting sized to connect to a hose or other conduit that is in turn connected to a vacuum pump. Valves or switches may be used to selectively enable suction from the vacuum pump to each of connectors 402, 404, and 406. In some embodiments, connectors 402, 404, and 406 may be integral with suction fixture 400. Alternatively, connectors 402, 404, and 406 may be removably connectable (e.g., via screw threads) to suction fixture 400 to allow for different sizes of connectors to be used with suction fixture 400.

Suction fixture 400 also includes vertical mounting holes 424 and 428, as well as horizontal mounting holes 426 and 430. Vertical mounting holes 424 and 428 allow suction fixture 400 to be affixed to a horizontal surface to stabilize and position suction fixture 400 to be used in the stacking of laser diode bars. Similarly, horizontal mounting holes 426 and 430 allow suction fixture 400 to be affixed to a vertical surface.

Suction fixture 400 further includes first pin 420 and second pin 422. Pins 420 and 422 are spaced and sized to matingly interface with corresponding holes 434 and 436 in alignment plate 432. Pins 420 and 422 as well as holes 434 and 436 are configured to secure and position alignment plate 432 with respect to suction fixture 400, as illustrated in FIG. 5.

Alignment plate 432 has a first side (facing approximately out and to the right of the page) that defines a common plane for aligning the emitting edges of the laser diode bars and a second side (facing approximately into and left of the page) opposite the first side. The alignment plate 432 further includes an array 438 of microholes, a first set of macroholes 440, 442, and 444, as well as a second set of macroholes 446, 448, and 450, each of which extend from the first side to the second side of alignment plate 432. The microholes are smaller than the macroholes, and the two hole types are accordingly referred to as "micro" and "macro," respectively. In an example embodiment, the microholes may range in size from 100 microns to 250 microns, and the macroholes may range in size from 500 microns to 2,000 microns.

When suction fixture 400 and alignment plate 432 are assembled together as shown in FIG. 5, the first set of macroholes 440, 442, and 444 overlays first cavity 408, array 438 of microholes overlays second cavity 410, and the second set of macroholes 446, 448, and 450 overlays third cavity 412. As a result, a vacuum source provided by way of connectors 402, 404, and 406 can selectively apply suction through the first set of macroholes 440, 442, and 444, array 438 of microholes, and second set of macroholes 446, 448, and 450, respectively, from the second side of alignment plate 432. Valves may be placed in series between the vacuum source and each of connectors 402, 404, and 406 to allow the suction to be selectively controlled (e.g., manually or electronically).

The vertical spacing between the first set of macroholes 440, 442, and 444, the array 438 of microholes, and the second set of macroholes 446, 448, and 450 is such that, when suction fixture 400 and alignment plate 432 are assembled together, (i) there is fluid communication between cavity 408 and the first set of macroholes 440, 442, and 444, but not array 438 or the second set of macroholes 446, 448, and 450, (ii) there is fluid communication between cavity 410 and array 438, but not the first set of macroholes 440, 442, and 444 or the second set of macroholes 446, 448, and 450, and (iii) there is fluid communication between cavity 412 and the second set of macroholes 446, 448, and 450, but not array 438 or the first set of macroholes 440, 442, and 444. This selective fluid coupling between the cavities and holes may be further aided by including one or more gaskets or seals around the cavities 408, 410, and 412 to limit any undesired fluid flow between the cavities.

Suction may be provided through the microholes to draw the front edges of the laser diode bars (e.g., laser diode bars 308-318) against the first side of alignment plate 432 so that the front edges are aligned in the common plane. Similarly, suction may be provided through (i) the second set of macroholes 446, 448, and 450 to draw a front edge of a first conductive substrate (e.g., conductive plate 302) against the first side of alignment plate 432 and (ii) the first set of macroholes 440, 442, and 444 to draw a front edge of a second conductive substrate (e.g., conductive plate 304) against the first side of alignment plate 432, so that the respective front edges of the conductive substrates are aligned in the common plane. Once the front edges of the conductive plates and the laser diode bars are aligned in this way, the laser diode bars may be clamped together (e.g., via fastener 306) to maintain the aligned arrangement of front edges and provide good electrical contact between adjacent laser diode bars in the stack.

Suction fixture 400 may be mounted to a work area using mounting holes 424 and 428 or 426 and 430 such that the conductive plates and the laser diode bars are positioned at the height of the corresponding macroholes and microholes, respectively. Alternatively, the work area may be adjustable to achieve the desired positioning.

Further, the size of the microholes and macroholes, as well as their positioning along alignment plate 432 may be modified to accommodate conductive plates of different thickness, laser diode bars of different thickness, and different number of laser diode bars within a stack, among other properties. For example, additional microholes may be added along the vertical direction to allow for stacking and aligning additional laser diode bars in the vertical stack. In some instances, commensurate modifications may also be made to suction fixture 400 to accommodate any changes in the positioning of the microholes and macroholes (e.g., the height of cavity 410 may be increased to accommodate the increased number of microholes in the vertical direction).

Suction fixture 400 may be machined, printed in three dimensions, or die-cast, among other possibilities. Suction fixture 400 may be made out of metal, plastic, or ceramic, among other possibilities. The choice of material may be driven by the selected manufacturing technique. In one example, alignment plate 432 may be manufactured out of a printed circuit board (PCB) substrate using standard PCB manufacturing processes, including photolithography, metal etching, metal plating, laminating, Computer Numerical Control (CNC) Milling, and laser drilling, among other possibilities. The PCB manufacturing techniques may be employed to achieve a desired size for the microholes (e.g., under 250 microns).

The material of the PCB substrate may be chosen to provide the desired tensile strength and shear strength, among other properties. The PCB substrate may include, for example, polytetrafluoroethylene, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), or ceramics (e.g., Aluminum Oxide ($Al_2O_3$) or Aluminum Nitride (AlN)), among other possibilities.

A layer of metal (e.g., copper) may be deposited on the first side of alignment plate 432 to form a planar surface against which the laser diode bars may be aligned. The metal layer may compensate for any unevenness of the PCB substrate material. The metal layer may also provide structural rigidity to alignment plate 432 and reduce or eliminate any undesired bowing or flexing. In some embodiments, the entirety of alignment plate 432 may be surrounded or coated by a metal layer.

VI. EXAMPLE MICROHOLE ARRANGEMENT

Figure 6:
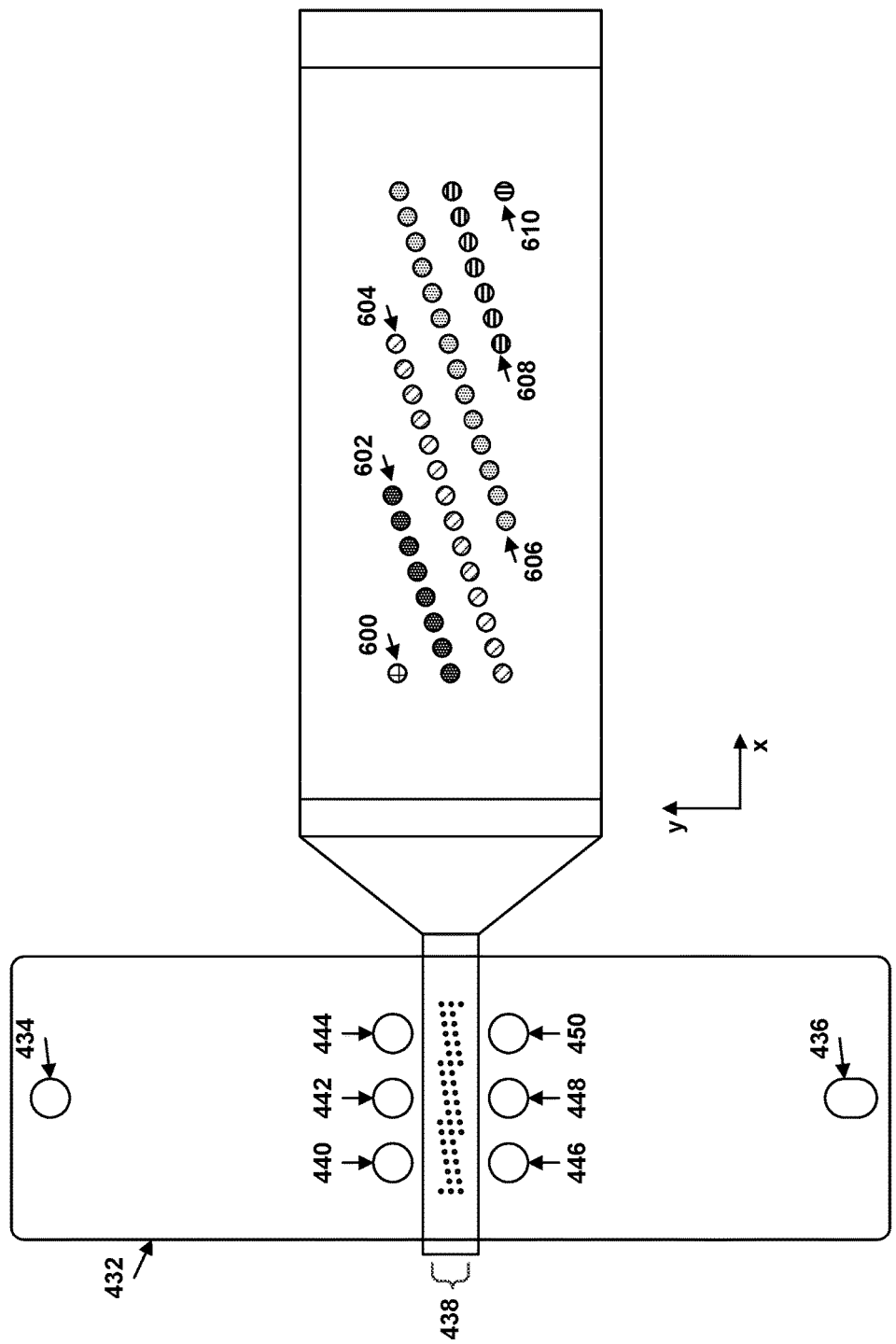
FIG. 6 illustrates microholes on an alignment plate, according to an example embodiment.

FIG. 6 shows a close-up view of array 438 of the microholes. The microholes can be arranged in alignment plate 432 as a set of parallel linear arrays 600, 602, 604, 606, 608, and 610, each including at least one microhole. Each of the linear arrays 600-610 may be at an angle relative to the x-axis, such as, for example, an angle between 5-degrees and 45-degrees (e.g., a 30-degree angle).

In an example embodiment, the centers of adjacent microholes within a given linear array may be offset from one another by 350-400 microns (e.g., 380 microns) along the x-direction, by 40-80 microns (e.g., 60 microns) along the y-direction, and by 350-400 microns (e.g., 385 microns) along the diagonal direction. The offsets may vary depending on the size of the microholes and the desired spacing between the microholes, among other factors. Further, the bottom-most hole in each of linear arrays 600-610 may be positioned at a different starting height along the y-direction to create staggering or offset between the arrays. For example, the bottom-most holes may be offset from one another by between 15 and 35 microns. Adjacent linear arrays may be offset from one another in the x-direction by 1500-3500 microns.

In another embodiment, the microholes can be arranged in alignment plate 432 as a randomly distributed pattern of microholes, or a staggered grid, among other possibilities. For example, the staggered grid may be formed by a plurality of linear arrays arranged at a 90-degree angle relative to the x-axis (i.e., parallel to the y-axis), with the bottom-most hole in each array positioned at a different starting height along the y-direction to create the staggering.

The laser diode bars may be stacked with the vertical axis of each respective laser diode bar parallel to the y-axis, and therefore the plane of each laser diode bar parallel to the x-axis. The pattern of microholes, their size, and the offsets therebetween may be selected such that each laser diode bar receives suction through a plurality of microholes. For example, with the arrangement of linear arrays, each laser diode bar may receive suction through a plurality of microholes including at least a first microhole in a first linear array of microholes and a second microhole in a second linear array of microholes.

The first set of macroholes 440, 442, and 444 and the second set of macroholes 446, 448, and 450 may each be arranged parallel to the x-axis, and therefore also parallel to the upper and lower surfaces of the laser diode bars. In some instances, the macroholes 440-450 may be replaced by additional arrays of microholes arranged into linear arrays.

VII. EXAMPLE LASER DIODE BAR STACKING OPERATIONS

Figure 7:
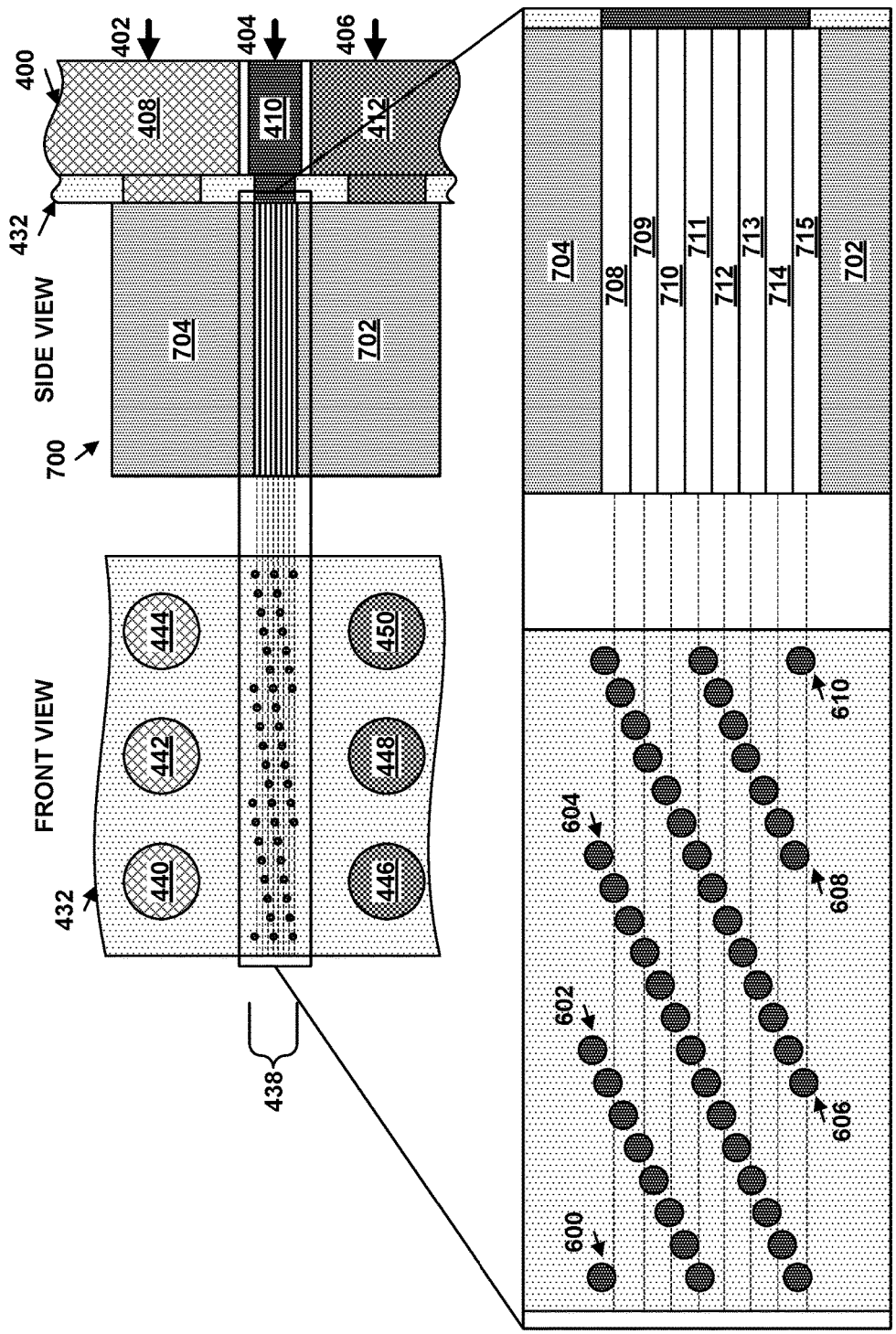
FIG. 7 illustrates a vacuum fixture being used to align laser diode bars, according to an example embodiment.

FIG. 7 illustrates how alignment plate 432 and suction fixture 400 may be used to vertically stack a plurality of laser diode bars 708-715 (i.e., laser diode bars 708, 709, 710, 711, 712, 713, 714, and 715) to create a vertical stack 700. Specifically, FIG. 7 shows (i) a partial front view of alignment plate 432, (ii) a corresponding side view of vertical stack 700, a portion of alignment plate 432, and a portion of suction fixture 400, and (iii) a close-up of array 438 of the microholes and vertical stack 700.

In one embodiment, the laser diode bars 708-715 may be stacked and aligned sequentially using the vacuum fixture. For example, a first conductive slab, plate, or substrate 702 (i.e., the equivalent of conductive plate 302 in FIGS. 3A and 3B) that will serve as a bottom conductor for the vertical laser diode stack 700 can be aligned against the first side of alignment plate 432 by applying suction through macroholes 446, 448, and 450 by way of cavity 412 and connector 406. Notably, the corresponding hatching patterns of the cavities and holes indicate fluid communication therebetween.

A first laser diode bar 715 can then be placed on top of first conductive slab 702. The front (emitting) edge (i.e., the right side, as drawn) of laser diode bar 715 can be aligned against the first side of alignment plate 432 by applying suction through at least some of the microholes by way of cavity 410 and connector 404. A second laser diode bar 714 can then be placed on top of laser diode bar 715, and the front edge of laser diode bar 714 can be aligned against the first side of alignment plate 432 by applying suction through at least some of the microholes, again by way of cavity 410 and connector 404. Similarly, a third laser diode bar 713 can then be placed on top of laser diode bar 714, and the front edge of laser diode bar 713 can be aligned against the first side of alignment plate 432 by applying suction through at least some of the microholes, yet again by way of cavity 410 and connector 404. The other laser diode bars 712, 711, 710, 709, and 708 can also be aligned in this way to complete vertical stack 700 to include a total of eight laser diode bars.

Once the stack of laser diode bars 708-715 has been aligned, a second conductive slab, plate, or substrate 704 (i.e., the equivalent of conductive plate 304 in FIGS. 3A and 3B) that will serve as a top conductor for the laser diode stack 700 can be aligned against the first side of alignment plate 432 by applying suction through macroholes 440, 442, and 444 by way of cavity 408 and connector 402. In some instances, conductive plates 702 and 704 as well as laser diode bars 708-715 may be aligned in parallel, by simultaneously providing suction via each of chambers 408, 410, and 412. Notably, aligning conductive plates 702 and 704 and laser diode bars 708-715, or some subset thereof, in parallel may require more suction force than the sequential alignment due to increased "sticking" between adjacent components caused by Van der Waals forces between adjacent surfaces of the adjacent components, as well as friction due to the weight of the stack.

The stack of laser diode bars can then be clamped together through first and second conductive plates 702 and 704, securing the assembly in place and providing electrical contact between conductive plates 702 and 704 as well as the plurality of laser diode bars 708-715.

The size of the microholes and their arrangement in linear arrays 600-610 results in each of laser diode bars 708-715 receiving suction through a plurality of microholes, the plurality including at least a first microhole in a first linear array of microholes and a second microhole in a second linear array of microholes. For example, laser diode bar 715 receives suction through microholes in linear arrays 604, 606, 608, and 610, as indicated by the dashed line.

Similarly, each remaining laser diode bar in the plurality of laser diode bars 708-715 receives suction through at least two microholes in at least two of the linear arrays 600-610, as indicated by the respective dashed lines. Further, some laser diode bars of the plurality of laser diode bars 708-715 may receive suction from two microholes in the same linear array (e.g., laser diode bar 708 receives suction through two microholes in linear array 602). With this arrangement of the microholes into linear arrays 600-610, each laser diode bar receives suction through at least two microholes, regardless of variations in the thickness of the laser diode bars or variations in the starting height at which the first laser diode bar is placed (e.g., due to variations in the thickness of conducting plate 702). Further, the likelihood of a laser diode bar receiving suction from additional microholes may be increased by bringing the linear arrays closer together and bringing adjacent holes in each linear array closer together (i.e., increasing the density of microholes).

In another embodiment, the microholes may be arranged in a different pattern such as a random distribution or a staggered grid. Nevertheless, the pattern may be designed such that each laser diode bar in the plurality of laser diode bars 708-715 receives suction through at least two microholes, regardless of variations in the thickness of the laser diode bars or variations in the starting height at which the first laser diode bar is placed. Further, the density of the holes (e.g., number of holes per unit area, or total hole area per total area of the region occupied by microhole array 438) may be increased to increase the likelihood of laser diode bars 708-715 receiving suction from additional microholes.

Figure 8:
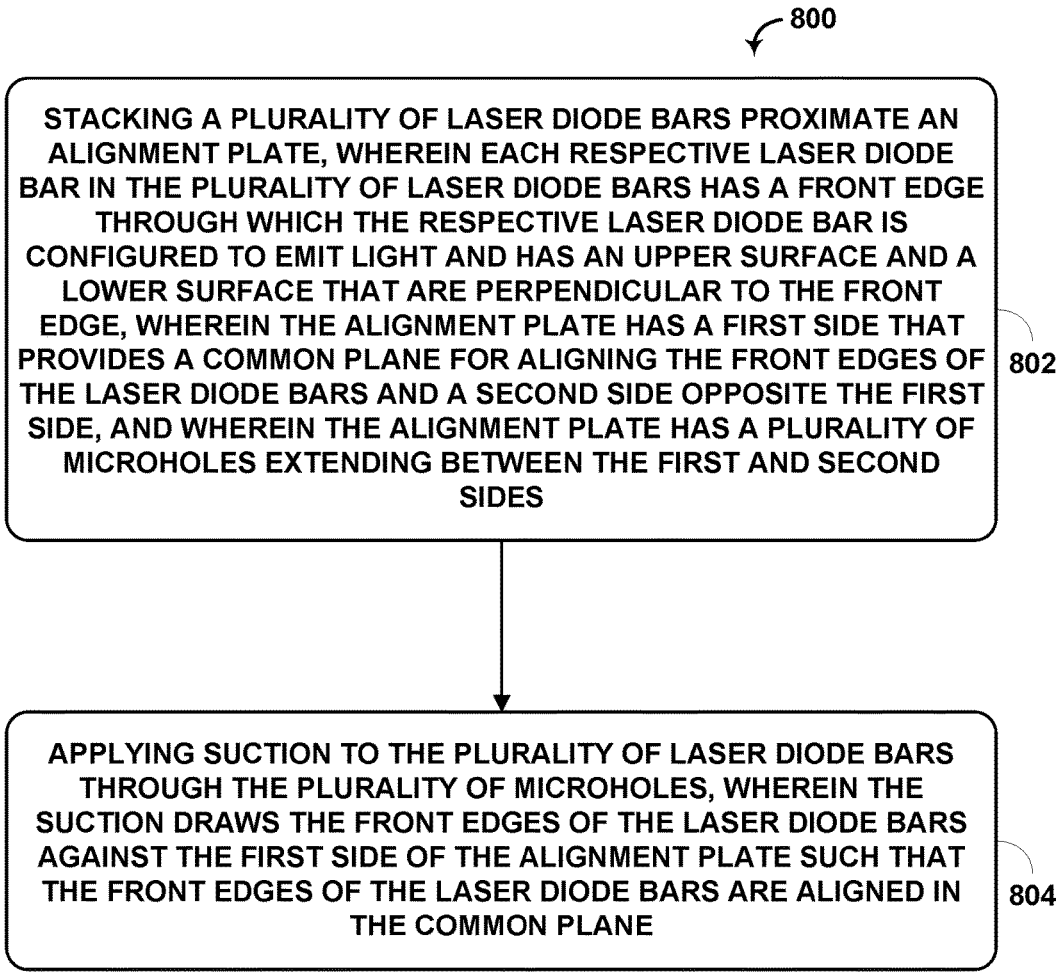
FIG. 8 illustrates a flow chart, according to an example embodiment.

FIG. 8 illustrates an example flow chart 800 of operations for stacking laser diode bars. The operations may involve using a vacuum fixture such as that illustrated in FIGS. 4-7 to align the front (emitting) edges of a plurality of laser diode bars to form a vertical stack.

In block 802, a plurality of laser diode bars (e.g., laser diode bars 708-715) may be stacked proximate an alignment plate (e.g., alignment plate 432). Each respective laser diode bar in the plurality of laser diode bars may have a front edge through which the respective laser diode bar is configured to emit light. Each respective laser diode bar may also have an upper surface and a lower surface that are perpendicular to the front edge. The alignment plate may have a first side that provides a common plane for aligning the front edges of the laser diode bars and a second side opposite the first side. The alignment plate may have a plurality of microholes (e.g., array 438) extending between the first and second sides. The plurality of laser diode bars may be stacked on top of a first conductive substrate, plate, or slab (e.g., conductive plate 702). Each of the laser diode bars may be stacked sequentially or in parallel.

In block 804, suction may be applied to the plurality of laser diode bars through the plurality of microholes. The suction may draw the front edges of the laser diode bars against the first side of the alignment plate such that the front edges of the laser diode bars are aligned in the common plane. A second conductive substrate, plate, or slab (e.g., conductive plate 702) may be placed on top of the stacked plurality of laser diodes.

The suction may be applied through the plurality of microholes using a suction fixture configured to interface with the alignment plate (e.g., suction fixture 400). The suction fixture and the alignment plate may be collectively referred to as a vacuum fixture. The alignment plate may also include a first plurality of macroholes (e.g., macroholes 446, 448, and 450) positioned below the plurality of microholes and a second plurality of macroholes positioned above the plurality of microholes (e.g., macroholes 440, 442, and 444). A size of the macroholes may be greater than a size of the microholes.

Suction may be applied to the first conductive substrate through the first plurality of macroholes to draw a front edge of the first conductive substrate against the first side of the alignment plate such that the front edge of the first conductive substrate is aligned in the common plane. In an example embodiment, suction may be applied to the first conductive substrate before the plurality of laser diodes are stacked thereon. Similarly, suction may be applied to the second conductive substrate through the second plurality of macroholes to draw a front edge of the second conductive substrate against the first side of the alignment plate such that the front edge of the first conductive substrate is aligned in the common plane. In an example embodiment, suction may be applied to the second conductive substrate after the plurality of laser diodes are stacked on the first conductive substrate.

In some embodiments, the plurality of laser bars may be clamped together while the suction is being applied through the microholes and the front edges of the laser diode bars are aligned in the common plane. Specifically, the stacked plurality of laser diode bars may be clamped between the first and second conductive substrates. Clamping may secure the aligned arrangement in place and facilitate good electrical contact between adjacent laser diode bars. Clamping may involve application of a symmetric clamping force such that alignment of the plurality of laser diode bars is not disturbed during clamping. The first and second conductive substrates may operate as electrical terminals for the laser diode bar stack. The first and second conductive substrates may also function as heat sinks for the laser diode bar stack.

In some embodiments, the operations of flow chart 800 may be performed manually by a human. Alternatively, the operations of flow chart 800 may be performed by an automated system that includes robotic devices. Thus, for example, the operations of blocks 802 and 804 may involve providing instructions to cause a robotic device (e.g., a die bonder) to stack the plurality of laser diode bars proximate the alignment plate and providing instructions to cause a suction device to apply suction to the plurality of laser diode bars through the plurality of microholes, respectively. The robotic device may further be caused to clamp the plurality of laser diode bars together while suction is being applied through the microholes and the front edges of the laser diode bars are aligned in the common plane.

Although operation of the vacuum fixture is described primarily in the context of stacking laser diode bars, the vacuum fixture may also be used to stack and align other devices or components. In one example, the vacuum fixture may be used to stack a plurality of semiconductor dies to assist in the alignment, assembly, bonding, and other interfacing of three-dimensional integrated circuits. In another example, the vacuum fixture may be used to stack a plurality of micro-electro-mechanical-system (MEMS) devices, electrical devices, or optical devices to form an integrated system. For example, the vacuum fixture may be used to align a laser source with a waveguide. Other applications for the vacuum fixture are possible.

VIII. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method comprising:
   stacking a plurality of laser diode bars proximate an alignment plate, wherein each respective laser diode bar in the plurality of laser diode bars has a front edge through which the respective laser diode bar is configured to emit light and has an upper surface and a lower surface that are perpendicular to the front edge, wherein the alignment plate has a first side that provides a common plane for aligning the front edges of the laser diode bars and a second side opposite the first side, and wherein the alignment plate has a plurality of microholes extending between the first and second sides; and
   applying suction to the plurality of laser diode bars through the plurality of microholes, wherein the suction draws the front edges of the laser diode bars against the first side of the alignment plate such that the front edges of the laser diode bars are aligned in the common plane.

2. The method of claim 1, further comprising:
   while the suction is being applied through the microholes and the front edges of the laser diode bars are aligned in the common plane, clamping the plurality of laser bars together.

3. The method of claim 1, wherein:
   each respective laser diode bar in the plurality of laser diode bars has a vertical axis that is parallel to the front edge of the respective laser diode bar, and wherein the vertical axis extends through the upper surface and the lower surface of the respective laser diode bar; and
   stacking the plurality of laser diode bars forms a vertically stacked arrangement in which (i) the vertical axes of the plurality of laser diode bars are parallel and (ii) at least one laser diode bar has an upper surface in contact with a lower surface of an adjacent laser diode bar.

4. The method of claim 3, wherein the upper and lower surfaces of each respective laser diode bar are electrically conductive and provide electrical connections to the respective laser diode bar.

5. The method of claim 4, wherein the laser diode bars are electrically connected together in the vertically stacked arrangement.

6. The method of claim 1, wherein stacking the plurality of laser diode bars proximate the alignment plate comprises sequentially placing the respective laser diode bars proximate the alignment plate while applying suction through the plurality of microholes.

7. The method of claim 1, wherein the plurality of microholes comprise a set of parallel linear arrays of microholes, wherein each linear array of microholes is at an angle with respect to the upper and lower surfaces of the laser diode bars.

8. The method of claim 7, wherein applying suction to the plurality of laser diode bars through the plurality of microholes comprises:
   applying suction to each respective laser diode bar in the plurality of laser diode bars through a respective set of at least two microholes, the at least two microholes including at least a first microhole in a first linear array of microholes and a second microhole in a second linear array of microholes.

9. The method of claim 1, wherein the alignment plate has a first plurality of macroholes positioned below the plurality of microholes and a second plurality of macroholes positioned above the plurality of microholes, wherein a size of the macroholes is greater than a size of the microholes, and wherein the method further comprises:

provide a first conductive substrate on top of which the plurality of the laser diode bars are to be stacked;

applying suction to the first conductive substrate through the first plurality of macroholes to draw a front edge of the first conductive substrate against the first side of the alignment plate such that the front edge of the first conductive substrate is aligned in the common plane;

providing a second conductive substrate on top of the stacked plurality of laser diode bars; and applying suction to the second conductive substrate through the second plurality of macroholes to draw a front edge of the second conductive substrate against the first side of the alignment plate such that the front edge of the second conductive substrate is aligned in the common plane.

10. The method of claim 9, wherein the first plurality of macroholes comprise a first linear array of macroholes, wherein the second plurality of macroholes comprise a second linear array of macroholes, and wherein the first and second linear arrays of macroholes are parallel to the upper and lower surfaces of the laser diode bars.

11. The method of claim 1, wherein stacking the plurality of laser diode bars proximate the alignment plate comprises causing a robotic die bonder to pick and place each of the plurality of laser diode bars proximate the alignment plate.

12. A non-transitory computer readable storage medium having stored thereon instructions that, when executed by a computing device, cause the computing device to perform operations comprising:

providing instructions to cause a robotic device to stack a plurality of laser diode bars proximate an alignment plate, wherein each respective laser diode bar in the plurality of laser diode bars has a front edge through which the respective laser diode bar is configured to emit light and has an upper surface and a lower surface that are perpendicular to the front edge, wherein the alignment plate has a first side that provides a common plane for aligning the front edges of the laser diode bars and a second side opposite the first side, and wherein the alignment plate has a plurality of microholes extending between the first and second sides; and providing instructions to cause a suction device to apply suction to the plurality of laser diode bars through the plurality of microholes, wherein the suction draws the front edges of the laser diode bars against the first side of the alignment plate such that the front edges of the laser diode bars are aligned in the common plane.

13. The non-transitory computer readable storage medium of claim 12, wherein the operations further comprise:

providing instructions to cause the robotic device to clamp the plurality of laser diode bars together while the suction is being applied through the microholes and the front edges of the laser diode bars are aligned in the common plane.

* * * * *